(12) United States Patent
Ahmed et al.

(10) Patent No.: US 12,399,216 B2
(45) Date of Patent: *Aug. 26, 2025

(54) METHODS AND SYSTEMS FOR REMOTE ACCESS HARDWARE TESTING

(71) Applicant: DISH Network L.L.C., Englewood, CO (US)

(72) Inventors: Mansoor Ahmed, Bangalore (IN); Hariprasanth Mohanraj, Bengaluru (IN)

(73) Assignee: DISH Network L.L.C., Englewood, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/757,076

(22) Filed: Jun. 27, 2024

(65) Prior Publication Data

US 2024/0345158 A1    Oct. 17, 2024

Related U.S. Application Data

(63) Continuation of application No. 17/882,264, filed on Aug. 5, 2022, now Pat. No. 12,044,728.

(51) Int. Cl.
  *G01R 31/28* (2006.01)
  *G01R 31/317* (2006.01)

(52) U.S. Cl.
  CPC ..... *G01R 31/2896* (2013.01); *G01R 31/2884* (2013.01); *G01R 31/2886* (2013.01); *G01R 31/31705* (2013.01)

(58) Field of Classification Search
  CPC ............ G01R 31/2896; G01R 31/2884; G01R 31/2886; G01R 31/31705
  See application file for complete search history.

(56) References Cited

U.S. PATENT DOCUMENTS

| | | | |
|---|---|---|---|
| 5,937,154 A | 8/1999 | Tegethoff | |
| 10,901,032 B1* | 1/2021 | Afanador | G06N 5/02 |
| 12,044,728 B2* | 7/2024 | Ahmed | G01R 31/2834 |
| 2004/0189332 A1* | 9/2004 | Liang | G01R 1/07392 |
| | | | 324/750.25 |
| 2010/0295552 A1* | 11/2010 | Li | G01R 31/2808 |
| | | | 324/537 |
| 2012/0182154 A1 | 7/2012 | Liang et al. | |
| 2017/0068771 A1 | 3/2017 | Muchaidze et al. | |
| 2019/0163618 A1 | 5/2019 | Akiona et al. | |
| 2020/0033403 A1 | 1/2020 | Bush et al. | |
| 2020/0064372 A1* | 2/2020 | Arlinsky | G01R 1/06705 |

(Continued)

*Primary Examiner* — Eman A Alkafawi
*Assistant Examiner* — Suresh K Rajaputra
(74) *Attorney, Agent, or Firm* — Perkins Coie LLP

(57) ABSTRACT

The present disclosure is directed to methods and systems for remote access hardware testing. A user can remotely control probes connected to an oscilloscope to collect signal measurements of test points on a circuit board. The user can control the probe point position on the circuit board using an application on a device to enter the test point locations. In some implementations, a user controls the probe machine using remote controls and a camera video feed to identify the test points on the circuit board and capture measurements. The hardware testing system can automate the measurement process with a script or by using machine learning to identify test points via a camera, controlling the probe machine, and capturing measurements of the test point.

20 Claims, 5 Drawing Sheets

(56) References Cited

U.S. PATENT DOCUMENTS

2021/0148975 A1* 5/2021 Strickling ............... B25J 11/00
2022/0128618 A1   4/2022 Thiel et al.
2024/0044972 A1   2/2024 Ahmed et al.

* cited by examiner

METHODS AND SYSTEMS FOR REMOTE ACCESS HARDWARE TESTING

CROSS-REFERENCE TO RELATED APPLICATION

This application is a continuation of U.S. patent application Ser. No. 17/882,264, filed Aug. 5, 2022, entitled "METHODS AND SYSTEMS FOR REMOTE ACCESS HARDWARE TESTING," which is incorporated herein by reference in its entirety.

BACKGROUND

In some cases, technicians are restricted from physically accessing lab equipment, such as during a pandemic. However, due to limitations of the equipment, electrostatic discharge (ESD) precautions, and soldering dependency, users are unable to capture hardware signal measurements for different interfaces on a circuit board when the users are remote from the lab equipment.

BRIEF DESCRIPTION OF THE DRAWINGS

The techniques introduced here may be better understood by referring to the following Detailed Description in conjunction with the accompanying drawings, in which like reference numerals indicate identical or functionally similar elements.

DETAILED DESCRIPTION

Aspects of the present disclosure are directed to methods and systems for remote access hardware testing. The hardware testing system can include equipment, such as a circuit board (e.g., printed circuit board assembly (PCBA)), oscilloscope, probes, controllers, lights, machines to hold and move probes, cameras, or soldering devices, and a device executing an application for remote access to the equipment. The circuit board is fixed at a location on a fixture (e.g., test fixture, PCB holder, etc.) that corresponds to an X-Y grid so each test point on the circuit board has identification coordinates in relation to an [X,Y] location of the circuit board. A user can connect probes to an oscilloscope and set up the equipment for remote access testing of the circuit board. The hardware testing system can align the equipment for remote testing by verifying the X-Y coordinates of the circuit board align with the X-Y coordinates of the probe machine controlling the position of the probes. For example, the origin point [0,0] of the circuit board is the same as the origin point identified by the probe machine.

A user can remotely control the oscilloscope and probe machine to collect signal measurements of test points on the circuit board. The user can control the probe point position on the circuit board using an application on a device to enter the test point locations (e.g., [X,Y] coordinates). In some implementations, a user controls the probe machine using remote controls and a camera video feed to identify the test points on the circuit board and capture measurements. The hardware testing system can automate the measurement process with a script or by using machine learning to identify test points via a camera, controlling the probe machine, and capturing measurements of the test point.

Methods and systems disclosed herein can provide technical advantages over conventional systems. The disclosed hardware testing system provides: 1) the ability to remotely control an oscilloscope and capture signals measurement; 2) the ability to remotely change the positions of probes; 3) the ability to remotely validate measured signals on a circuit board; 4) the ability to remotely measure and validate different interface signals on a circuit board fixed into the fixture; and 5) the ability to avoid manual errors while probing or soldering by using a machine rather than a human.

Figure 1:
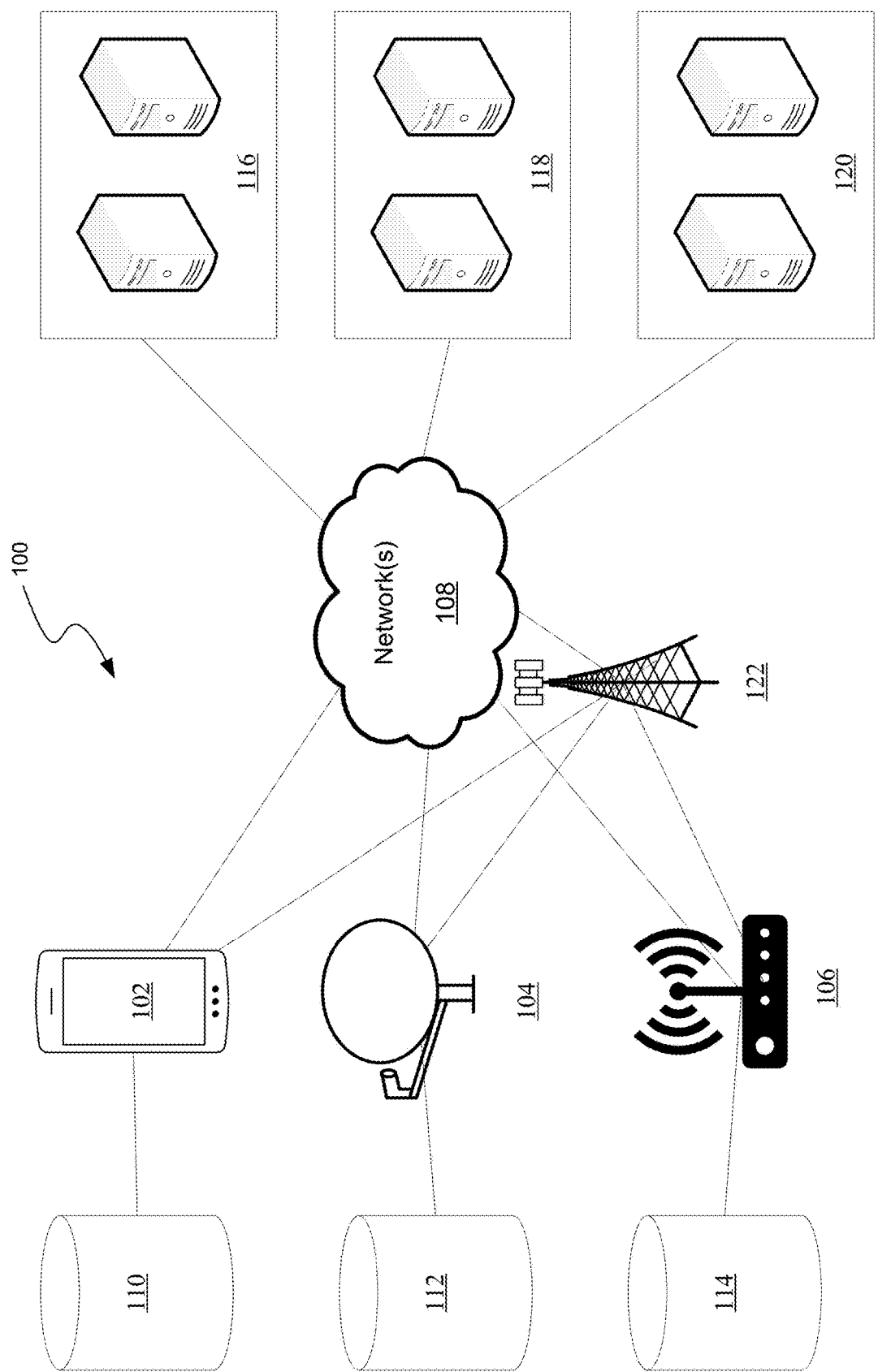
FIG. 1 illustrates an example of a distributed system for remote access hardware testing, in accordance with one or more embodiments of the present technology.

FIG. 1 illustrates an example of a distributed system for remote access hardware testing. Example system 100 presented is a combination of interdependent components that interact to form an integrated whole for remote access hardware testing. Components of the systems may be hardware components or software implemented on, and/or executed by, hardware components of the systems. For example, system 100 comprises client devices 102, 104, and 106, local databases 110, 112, and 114, network(s) 108, and server devices 116, 118, and/or 120.

Client devices 102, 104, and 106 may be configured to support remotely controlling a robotic device (e.g., probe machine) to collect signal measurements with an oscilloscope at test points on a circuit board. In one example, a client device 102 may be, an oscilloscope, a probe machine, a camera, a soldering machine, a mobile phone, a client device 104 may be a smart OTA antenna, and a client device 106 may be a broadcast module box (e.g., set-top box). In other example aspects, client device 106 may be a gateway device (e.g., router) that is in communication with sources, such as ISPs, cable networks, internet providers, or satellite networks. Other possible client devices include but are not limited to tablets, personal computers, televisions, etc. In aspects, a client device, such as client devices 102, 104, and 106, may have access to a networks from a gateway. In other aspects, client devices 102, 104, and 106, may be equipped to receive data from a gateway. The signals that client devices 102, 104, and 106 may receive may be transmitted from satellite broadcast tower 122. Broadcast tower 122 may also be configured to communicate with network(s) 108, in addition to being able to communicate directly with client devices 102, 104, and 106. In some examples, a client device may be a set-top box that is connected to a display device, such as a television (or a television that may have set-top box circuitry built into the television mainframe).

Client devices 102, 104, and 106 may be configured to run software that allows a user to remotely access and control a probe machine to collect signal measurements, using probes and an oscilloscope, of test points on a circuit board. Client devices 102, 104, and 106 may access equipment (e.g., probe machine, oscilloscope, circuit board, etc.) and data (e.g., signal measurements) through the networks. The content data may be stored locally on the client device or run remotely via network(s) 108. For example, a client device may receive a signal from broadcast tower 122 containing content data. The signal may indicate user requested media content. The client device may receive this user requested content data and subsequently store this data locally in databases 110, 112, and/or 114. In alternative scenarios, the user requested content data may be transmitted from a client device (e.g., client device 102, 104, and/or 106) via network(s) 108 to be stored remotely on server(s) 116, 118, and/or 120. A user may subsequently access the media content data from a local database (110, 112, and/or 114) and/or external database (116, 118, and/or 120), depending on where the media content data may be stored. The system may be configured to receive and process user requested content data in the background.

In some example aspects, client devices 102, 104, and/or 106 may be equipped to receive signals from an input device. Signals may be received on client devices 102, 104, and/or 106 via Bluetooth, Wi-Fi, infrared, light signals, binary, among other mediums and protocols for transmitting/receiving signals. For example, a user may use a mobile device 102 to check for the content data from a channel from an OTA antenna (e.g., antenna 104). A graphical user interface may display on the mobile device 102 the requested content data. Specifically, at a particular geolocation, the antenna 104 may receive signals from broadcast tower 122. The antenna 104 may then transmit those signals for analysis via network(s) 108. The results of the analysis may then be displayed on mobile device 102 via network(s) 108. In other examples, the results of the analysis may be displayed on a television device connected to a broadcast module box, such as broadcast module box 106.

In other examples, databases stored on remote servers 116, 118, and 120 may be utilized to assist the system in providing a user remote access to equipment and control a probe machine to collect signal measurements, using probes and an oscilloscope, of test points on a circuit board. Such databases may contain certain content data such as signal measurements, instructions on how to remotely access the equipment, or an application for remote access hardware testing. Such data may be transmitted via network(s) 108 to client devices 102, 104, and/or 106 to assist in identifying user requested media content. Because broadcast tower 122 and network(s) 108 are configured to communicate with one another, the systems and methods described herein may be able to identify requested media content in different sources, such as streaming services, local and cloud storage, cable, satellite, or OTA.

Figure 2:
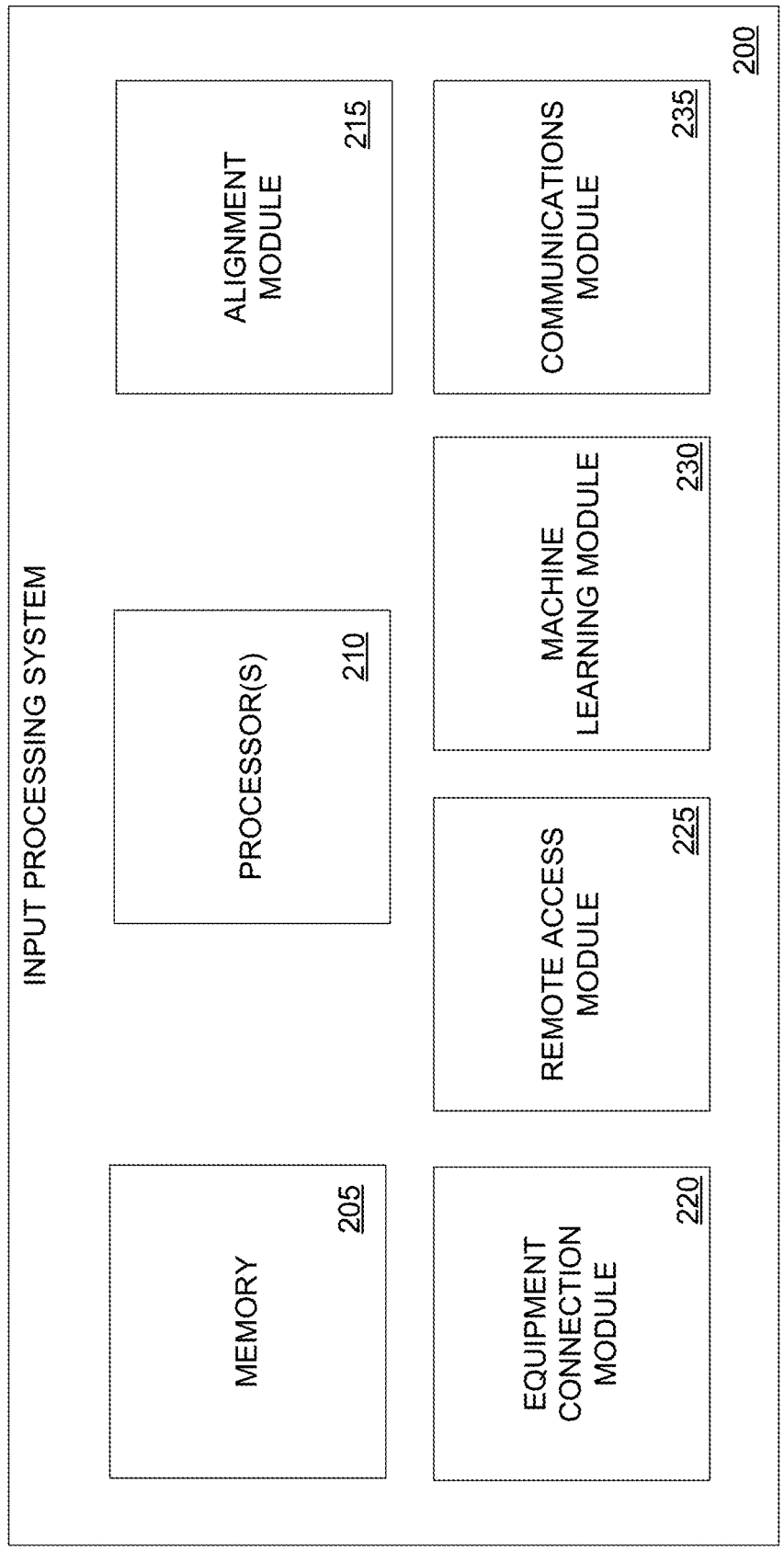
FIG. 2 illustrates an example input processing system for implementing systems and methods for remote access hardware testing.

FIG. 2 illustrates an example input processing system for implementing systems and methods for remote access hardware testing. The input processing system 200 (e.g., one or more data processors) is capable of executing algorithms, software routines, and/or instructions based on processing data provided by a variety of sources related to remotely accessing and controlling a probe machine to collect signal measurements, using probes and an oscilloscope, of test points on a circuit board. The input processing system can be a general-purpose computer or a dedicated, special-purpose computer. According to the embodiments shown in FIG. 2, the disclosed system can include memory 205, one or more processors 210, alignment module 215, equipment connection module 220, remote access module 225, machine learning module 230, and communications module 235. Other embodiments of the present technology may include some, all, or none of these modules and components, along with other modules, applications, data, and/or components. Still yet, some embodiments may incorporate two or more of these modules and components into a single module and/or associate a portion of the functionality of one or more of these modules with a different module.

Memory 205 can store instructions for running one or more applications or modules on processor(s) 210. For example, memory 205 could be used in one or more embodiments to house all or some of the instructions needed to execute the functionality of alignment module 215, equipment connection module 220, remote access module 225, machine learning module 230, and communications module 235. Generally, memory 205 can include any device, mechanism, or populated data structure used for storing information. In accordance with some embodiments of the present disclosures, memory 205 can encompass, but is not limited to, any type of volatile memory, nonvolatile memory, and dynamic memory. For example, memory 205 can be random access memory, memory storage devices, optical memory devices, magnetic media, floppy disks, magnetic tapes, hard drives, SIMMs, SDRAM, RDRAM, DDR, RAM, SODIMMs, EPROMs, EEPROMs, compact discs, DVDs, and/or the like. In accordance with some embodiments, memory 205 may include one or more disk drives, flash drives, one or more databases, one or more tables, one or more files, local cache memories, processor cache memories, relational databases, flat databases, and/or the like. In addition, those of ordinary skill in the art will appreciate many additional devices and techniques for storing information that can be used as memory 205. In some example aspects, memory 205 may store at least one database containing the application for remotely accessing and controlling a probe machine to capture signal measurements, using probes and an oscilloscope, of test points on a circuit board.

Alignment module 215 may be configured to determine whether the circuit board orientation is aligned with the probe machine. The alignment module 215 can use an automation fixture device to position and fix the probe on a measurement test point on circuit board. The circuit board is fixed at a location on a board test fixture that corresponds to an X-Y grid so each test point on the circuit board has identification coordinates in relation to an [X,Y] location of the circuit board. The alignment module 215 can align the equipment for remote testing by verifying the X-Y coordinates of the circuit board align with the X-Y coordinates of the probe machine controlling the position of the probes. For example, the origin location [0,0] of the circuit board is the same as the origin location identified by the probe machine. In some implementations, a user verifies with a camera that the circuit board and probe machine are aligned. The alignment module 215 can align the probe with the test point so the probe contacts the test point at a predetermined angle (e.g., 45 degrees, 90 degrees, etc.)

Equipment connection module 220 may be configured to connect the probe machine to a probe(s). The probe machine holds the probe at a position on a measurement test point on the circuit board. The probe connects to the oscilloscope with a wired connection or wireless connection (e.g., with analog to digital conversion). In some cases, the probes (e.g., SMA probes) have probe points with a spring action on the probe machine which is controlled through a software application. The probe machine can have a mechanism to hold the probe securely (e.g., due to a threaded connection) as the probe machine moves the probe between test points on the circuit board. A spring mechanism in the probe reduces damage to the probe and the circuit board when the probe machine applies the probe to the test point on the circuit board.

Remote access module 225 may be configured to control the oscilloscope and probe machine to capture signal measurements of test points on the circuit board. The user can control the probe point position on the circuit board using an application to enter the test point locations (e.g., [X,Y] coordinates). The remote access module 225 can execute the application using remote access of the debug port of the circuit board. The remote access module 225 can change the position of the probes remotely and continue with other measurements. In some implementations, the remote access module 225 automates the measurement process with a script which contains a predetermined order of measurements and test point locations. When the remote access module 225 executes the script, the probe machine captures signal measurements using probes and the oscilloscope at the predetermined test points on the circuit board.

Machine learning module 230 may be configured to analyze an image or video (e.g., video stream from a camera) of a circuit board to identify test points and capture signal measurements at the test points. The machine learning module 230 may be configured to identify test points and capture signal measurements at the test points on a circuit board based on at least one machine-learning algorithm trained on at least one dataset reflecting user identified test points on a circuit board and capture signal measurements at the test points. The at least one machine-learning algorithms (and models) may be stored locally at databases and/or externally at databases (e.g., cloud databases and/or cloud servers). Client devices (e.g., automation fixture devices) may be equipped to access these machine learning algorithms and intelligently analyze an image or video of a circuit board to identify test points and capture signal measurements at the test points based on at least one machine-learning model that is trained on historical test points and signal measurements. For example, in high volume manufactured circuit boards, a technician's test point and signal measurement history may be collected to train a machine-learning model to automatically identify test points and capture signal measurements.

As described herein, a machine-learning (ML) model may refer to a predictive or statistical utility or program that may be used to determine a probability distribution over one or more character sequences, classes, objects, result sets or events, and/or to predict a response value from one or more predictors. A model may be based on, or incorporate, one or more rule sets, machine learning, a neural network, or the like. In examples, the ML models may be located on the client device, service device, a network appliance (e.g., a firewall, a router, etc.), or some combination thereof. The ML models may process historical test points and signal measurements and other data stores (e.g., hardware testing settings, hardware manuals, standards, etc.) to determine where to capture signal measurements on a circuit board. Based on an aggregation of data from hardware testing settings, hardware manuals, standards, user recorded instructions, and other user data stores, at least one ML model may be trained and subsequently deployed to automatically determine where to capture signal measurements on a circuit board. The trained ML model may be deployed to one or more devices. As a specific example, an instance of a trained ML model may be deployed to a server device and to a client device. The ML model deployed to a server device may be configured to be used by the client device when, for example, the client device is connected to the internet. Conversely, the ML model deployed to a client device may be configured to be used by the client device when, for example, the client device is not connected to the internet. In some instances, a client device may not be connected to the internet but still configured to receive satellite signals with multimedia information and channel guides. In such examples, the ML model may be locally cached by the client device.

Communications module 235 is associated with sending/receiving information (e.g., alignment module 215, equipment connection module 220, remote access module 225, and machine learning module 230) with a remote server or with one or more client devices, measurement equipment, routers, etc. These communications can employ any suitable type of technology, such as Bluetooth, WiFi, WiMax, cellular, single hop communication, multi-hop communication, Dedicated Short Range Communications (DSRC), or a proprietary communication protocol. In some embodiments, communications module 235 sends alignment information identified by the alignment module 215, equipment information identified by equipment connection module 220, and remote access information identified by remoted access module 225. Furthermore, communications module 235 may be configured to communicate data between a remote user device and the measurement equipment.

Figure 3:
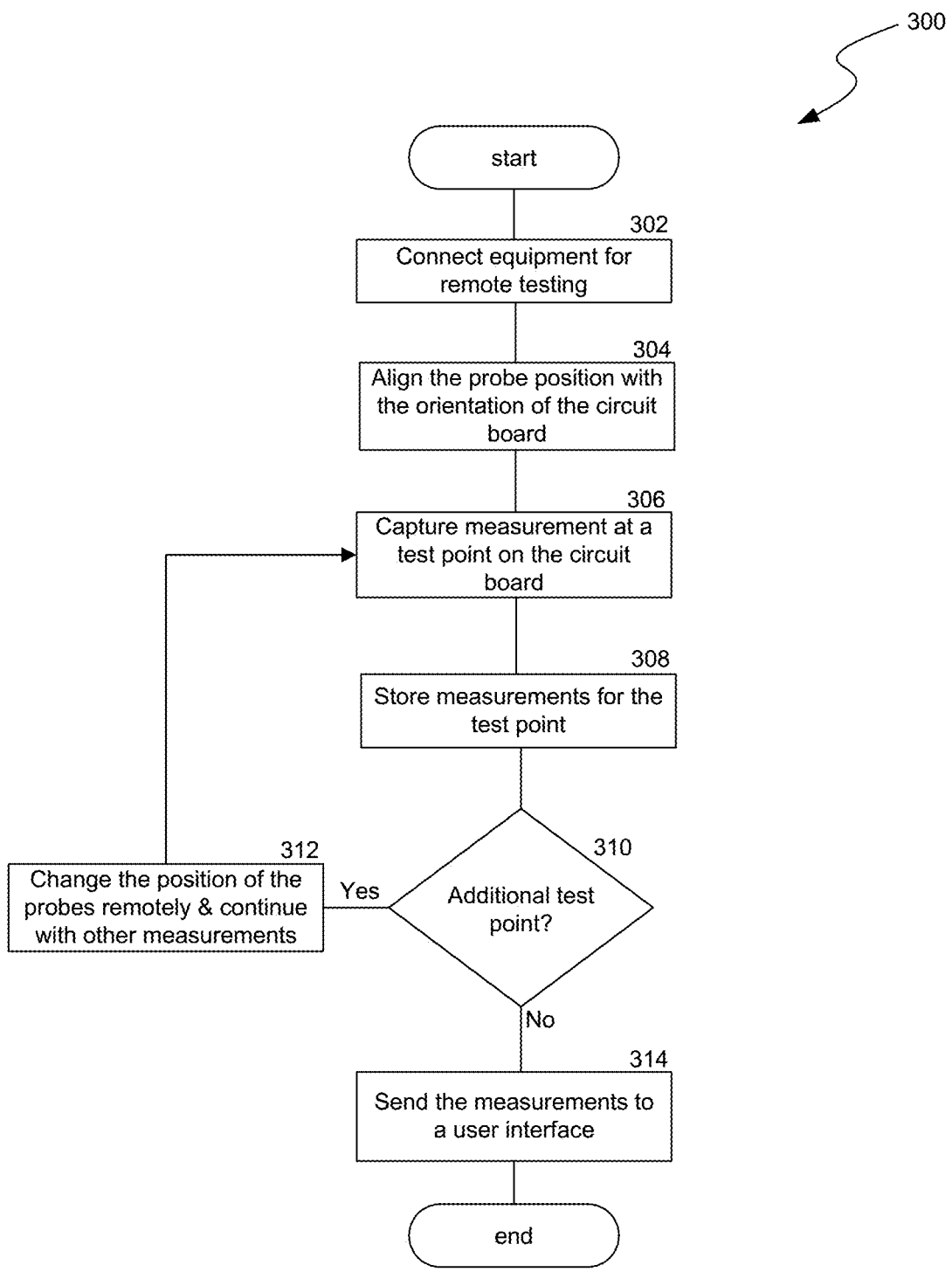
FIG. 3 is a flow diagram illustrating a process used in some implementations for remote access hardware testing.

FIG. 3 is a flow diagram illustrating a process 300 used in some implementations for remote access hardware testing. In some implementations, process 300 is triggered by a user activating a remote access application, powering on a device, connecting an oscilloscope to a probe machine, a user accessing a remote desktop to control testing equipment, or the user downloading an application on a device for remote access hardware testing. In various implementations, some or all of process 300 is performed locally on the user device or performed by cloud-based device(s) that can provide/support remote access hardware testing.

At block 302, process 300 connects the equipment together used for remote capturing signal measurements on a circuit board. A user or robotic device connects the probes and the probe machine to the oscilloscope to collect signal measurements on the circuit board. A user or robotic device places and secures the circuit board in a test fixture for the duration of the remote testing process. A user or robotic device, such as the probe machine, can solder the probes at test points on the circuit board and connect (via wired or wireless connections) the oscilloscope to the probes. A user can verify the equipment is accessible and controllable from a remote device by performing a preliminary measurement. A user can access the equipment from a remote location via an application executing on a user device. The user device can execute the application using remote access of the debug port of the circuit board. In some implementations, a camera on the probe machine or in the room of the testing facility can record the measurement process. Process 300 can select the probe with the smallest diameter (e.g., as a default selected/fixed probe) that can cover dense areas on the board. In some cases, changing a probe on the go can be a challenge and a bigger diameter probe head does not necessarily provide an advantage over a smaller diameter probe head. Process 300 can select the probe for the measurement based on the location of the test point on the circuit board and the components around the test point. For example, when the test point is in a crowded area on the circuit board, a probe with a smaller diameter is used rather than a probe used when the test point is not in a crowded area on the circuit board.

At block 304, process 300 aligns the equipment and the circuit board orientation. In some implementations, each circuit board has a specified fixture, so that the fixture gets aligned with the mounting holes on the circuit board, and the fixture is pre-aligned to the probe position as part of the setup. For example, the circuit board is fixed at a location on a board test fixture that corresponds to an X-Y grid so each test point on the circuit board has identification coordinates in relation to an X-Y location of the circuit board. Process 300 can align, via sensors and cameras, the equipment for remote testing with the circuit board by verifying the X-Y coordinates of the circuit board align with the X-Y coordinates of the probe machine controlling the position of the probes. For example, the origin location [0,0] of the circuit board is the same as the origin point identified by the probe machine. In some implementations, a user verifies via a camera that the circuit board and probe machine are aligned. The probe machine and the circuit board can align according to the geometry, such as dimensions, of the circuit board. For example, the circuit board fixed in the test fixture has a specified length and width. A corner or middle of the board is a refence point from which test points on the circuit board are identified and located. In some implementations, the test fixture or circuit board can include an alignment indicator, such as a QR code or any fixed and/or measurable marking, that the probe machine can identify. For example, a QR code can contain the reference point location on the test fixture or the reference point location on the circuit board. Each test point can have coordinates based on their location on the circuit board in relation to the reference point. Aligning the equipment and circuit board can ensure the location of a test point is properly identified by the probe machine.

Process 300 can align each probe with a test point, so the probe contacts the test point at a predetermined angle (e.g., 45 degrees, 90 degrees, etc.). In some implementations, the probe position is the same or different at each test point to collect a measurement(s). A camera or sensor attached to the probe machine can indicate to the user whether the probe is properly aligned and contacting the test point at the correct angle and depth. Remotely controlling the probe machine to operate the probes and/or solder the probes to the circuit board can eliminate the manual errors of a human, the probe machine can identify the exact X-Y location to apply the probe for a measurement. A user can remotely control the probe point position on the circuit board by entering the test point X-Y coordinates into the remote access application. The probe machine can navigate the probe to the entered location.

At block 306, process 300 controls the connected probe machine and oscilloscope to remotely collect signal measurements at the test points on the circuit board. The oscilloscope can capture the signal wave forms for the test point and perform an analysis of the wave forms. The oscilloscope can capture the signal wave forms for a predetermined duration or until a user issues a command via the user interface to end the measurement. Process 300 can capture different types of waveforms using a single probe connected to the oscilloscope. In some implementations, the oscilloscope captures multiple signal measurements at the test point over a period. Process 300 can automate measurement completion with a trigger. For example, whenever a signal rising edge is detected, the oscilloscope captures and saves the waveform, and proceeds to the next test point and measurement. In some implementations, a user (e.g., technician, engineer, etc.) manually controls the oscilloscope remotely or the measurements are captured according to time-based samples.

At block 308, process 300 stores the captured signal measurements for the test point on the oscilloscope, on the user device executing the remote access application, or in a measurement database. At block 310, process 300 determines whether there is an additional test point(s) at which to collect signal measurements. When there are additional test points, at block 312, process 300 changes the position of the probes remotely and collects the measurements at the next test point (as described at block 306). A user can control the probe machine and select the next test point location by entering the next test location X-Y coordinates into the application interface. In some implementations, the probe machine operates according to a script and automatically selects the next test point location based on the instructions of the script. If the probes are soldered to the circuit board, process 300 can remove the solder by heating up the connection point and using a desoldering pump. At the next test point location, a robotic device with a soldering capability can solder the probes at the test point on the circuit board, and process 300 remotely collects signal measurements with the oscilloscope at the test point on the circuit board. In some implementations, when the probe is not soldered to circuit board, process 300 attaches the probe to the circuit board and detaches the probe when the measurement is complete. When there are no additional test points, at block 314, process 300 sends the captured signal measurements to the user device in a notification. The notification can include a video of the equipment capturing the signal measurements.

Figure 4:
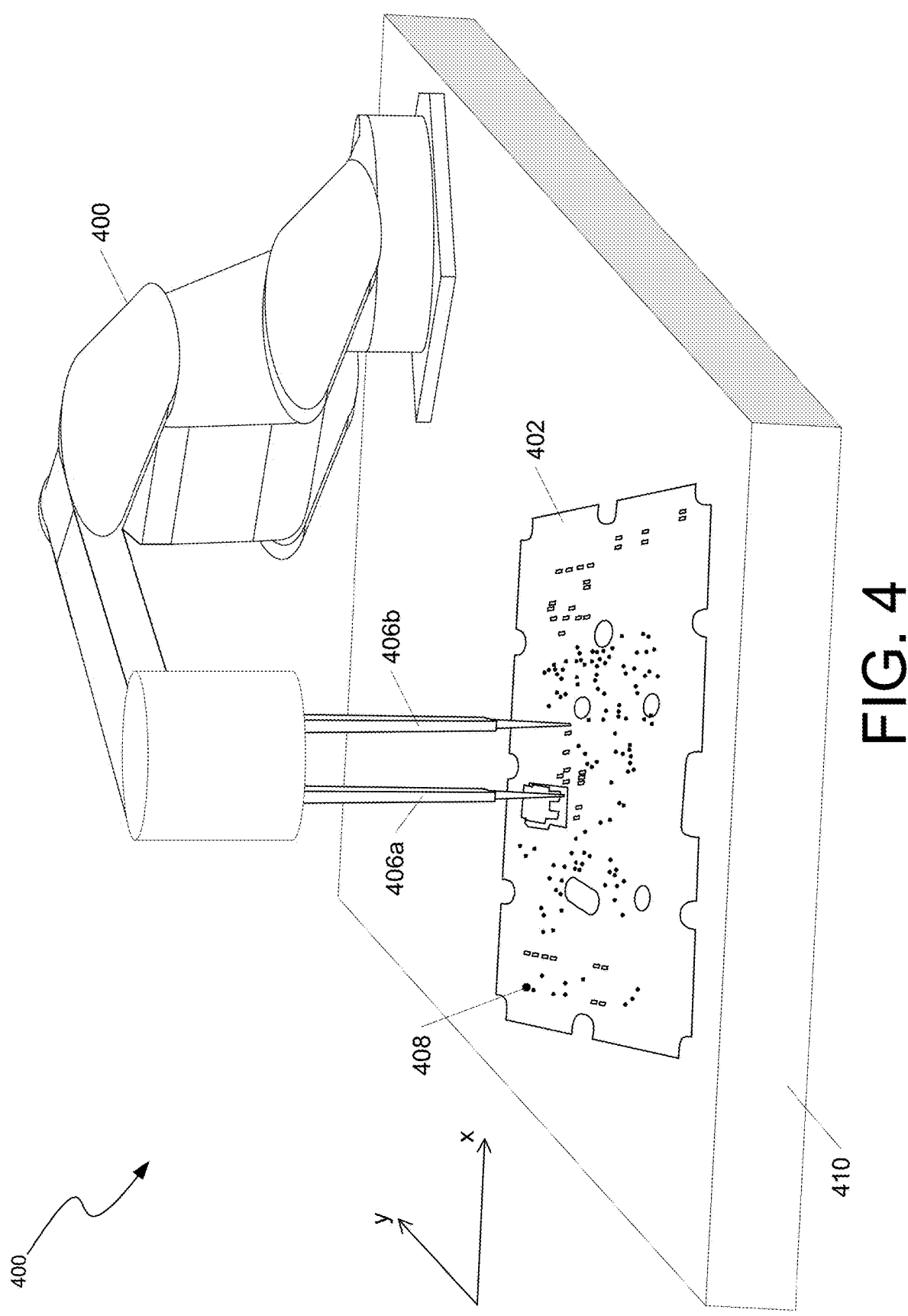
FIG. 4 is an illustration of an automation fixture device and circuit board in accordance with one or more embodiments of the present technology.

FIG. 4 is an illustration of an automation fixture device and circuit board. Probe machine 400 connects to probes 406*a* and 406*b* and an oscilloscope (not shown) to collect signal measurements on the circuit board 402 at test points, such as test point 408. Circuit board 402 is fixed and aligned in a test fixture 410. Circuit board 402 and probe machine 400 are aligned according to an X-Y grid so each test point, such as test point 408, on the circuit board 402 has identification coordinates.

Figure 5:
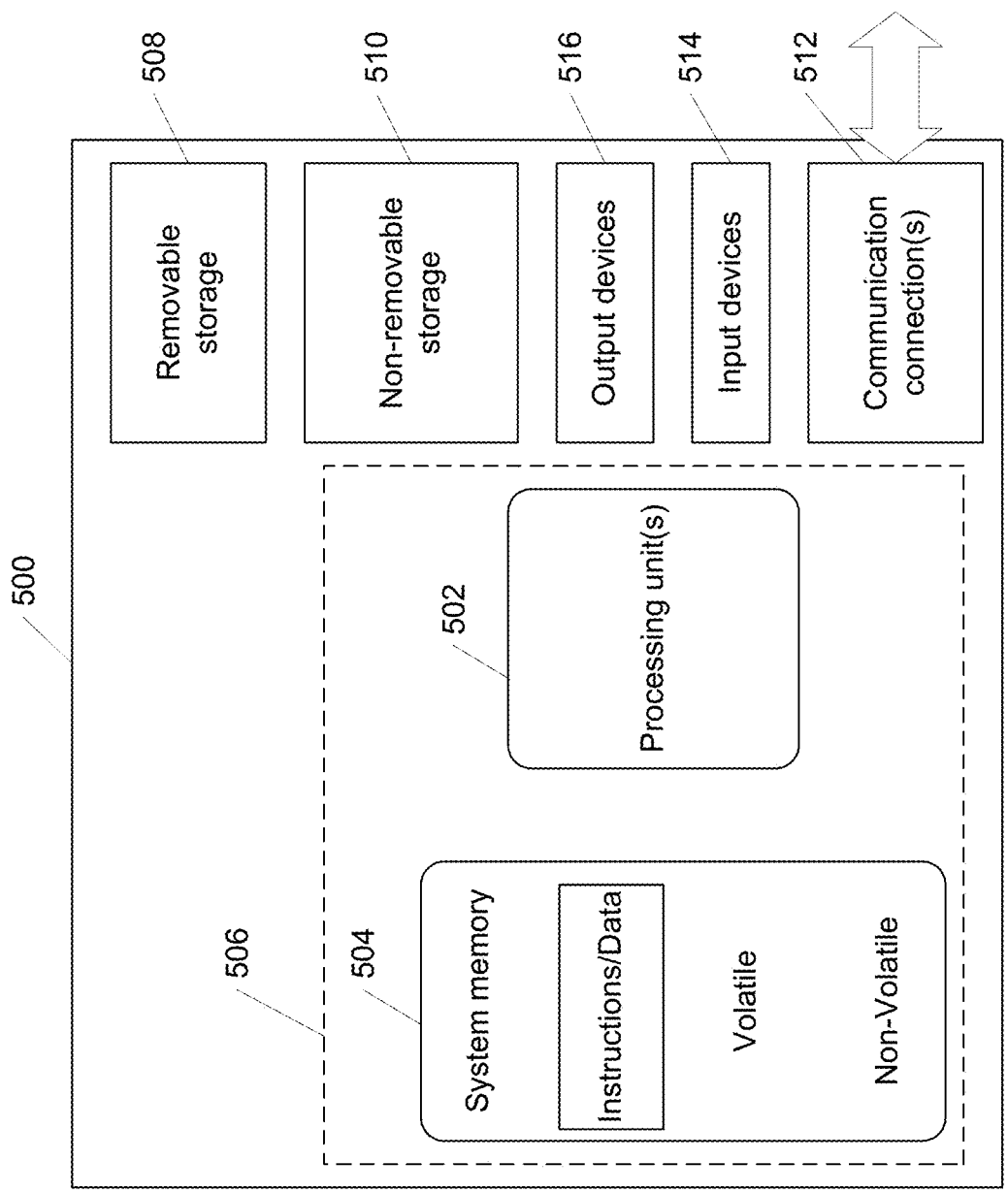
FIG. 5 illustrates one example of a suitable operating environment in which one or more of the present embodiments may be implemented.

FIG. 5 illustrates one example of a suitable operating environment in which one or more of the present embodiments may be implemented. This is only one example of a suitable operating environment and is not intended to suggest any limitation as to the scope of use or functionality. Other well-known computing systems, environments, and/or configurations that may be suitable for use include, but are not limited to, personal computers, server computers, handheld or laptop devices, multiprocessor systems, microprocessor-based systems, programmable consumer electronics such as smart phones, network PCs, minicomputers, mainframe computers, distributed computing environments that include any of the above systems or devices, and the like.

In its most basic configuration, operating environment 500 typically includes at least one processing unit 502 and memory 504. Depending on the exact configuration and type of computing device, memory 504 (storing, among other things, information related to detected devices, compression artifacts, association information, personal gateway settings, and instruction to perform the methods disclosed herein) may be volatile (such as RAM), non-volatile (such as ROM, flash memory, etc.), or some combination of the two. This most basic configuration is illustrated in FIG. 5 by dashed line 506. Further, environment 500 may also include storage devices (removable 508 and/or non-removable 510) including, but not limited to, magnetic or optical disks or tape. Similarly, environment 500 may also have input device(s) 514 such as keyboard, mouse, pen, voice input, etc., and/or output device(s) 516 such as a display, speakers, printer, etc. Also included in the environment may be one or more communication connections, 512, such as Bluetooth, WiFi, WiMax, LAN, WAN, point to point, etc.

Operating environment 500 typically includes at least some form of computer readable media. Computer readable media can be any available media that can be accessed by processing unit 502 or other devices comprising the operating environment. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, RAM, ROM EEPROM, flash memory or other memory technology, CD-ROM, digital versatile disks (DVD) or other optical storage, magnetic cassettes, magnetic tape, magnetic disk storage, or other magnetic storage devices, or any other tangible medium which can be used to store the desired information. Computer storage media does not include communication media.

Communication media embodies computer readable instructions, data structures, program modules, or other data in a modulated data signal such as a carrier wave or other transport mechanism and includes any information delivery media. The term "modulate data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The operating environment 500 may be a single computer (e.g., mobile computer) operating in a networked environment using logical connections to one or more remote computers. The remote computer may be a personal computer, a server, a router, a network PC, a peer device, an OTA antenna, a set-top box, or other common network node, and typically includes many or all of the elements described above as well as others not so mentioned. The logical connections may include any method supported by available communications media. Such networking environments are commonplace in offices, enterprise-wide computer networks, intranets, and the Internet.

Aspects of the present disclosure, for example, are described above with reference to block diagrams and/or operational illustrations of methods, systems, and computer program products according to aspects of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The description and illustration of one or more aspects provided in this application are not intended to limit or restrict the scope of the disclosure as claimed in any way. The aspects, examples, and details provided in this application are considered sufficient to convey possession and enable others to make and use the best mode of the claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and the alternate aspects falling within the spirit of the broader aspects of the general inventive concept embodied in this application that do not depart from the broader scope of the claimed disclosure.

From the foregoing, it will be appreciated that specific embodiments of the invention have been described herein for purposes of illustration, but that various modifications may be made without deviating from the scope of the invention. Accordingly, the invention is not limited except as by the appended claims. Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively.

Several implementations of the disclosed technology are described above in reference to the figures. The computing devices on which the described technology may be implemented can include one or more central processing units, memory, user devices (e.g., keyboards and pointing devices), output devices (e.g., display devices), storage devices (e.g., disk drives), and network devices (e.g., network interfaces). The memory and storage devices are computer-readable storage media that can store instructions that implement at least portions of the described technology. In addition, the data structures and message structures can be stored or transmitted via a data transmission medium, such as a signal on a communications link. Various communications links can be used, such as the Internet, a local area network, a wide area network, or a point-to-point dial-up connection. Thus, computer-readable media can comprise computer-readable storage media (e.g., "non-transitory" media) and computer-readable transmission media.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item, such as A and A; B, B, and C; A, A, B, C, and C; etc.

The above Detailed Description of examples of the technology is not intended to be exhaustive or to limit the technology to the precise form disclosed above. While specific examples for the technology are described above for illustrative purposes, various equivalent modifications are possible within the scope of the technology. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

What is claimed is:

1. A method comprising:
   aligning, by a robotic device, at least one probe with a circuit board on a test fixture;
   receiving, from a device, a verification instruction that the at least one probe aligns with the circuit board, wherein the device is remote from the test fixture;
   in response to receiving the verification instruction from the device, applying, by the robotic device, the at least one probe to a first test point on the circuit board; and
   collecting, by the robotic device connected to an oscilloscope, a first measurement from the first test point on the circuit board.

2. The method of claim 1, further comprising:
   identifying a second test point on the circuit board;
   changing a location of the at least one probe from the first test point to the second test point;
   applying, by the robotic device, the at least one probe to the second test point on the circuit board; and
   collecting a second measurement from the second test point on the circuit board.

3. The method of claim 1, further comprising:
   selecting the at least one probe from a plurality of probes based on a location of the first test point on the circuit board.

4. The method of claim 1, further comprising:
   identifying a location of the first test point on the circuit board on the test fixture, wherein the first test point is selected on a user interface;
   selecting a diameter size of the at least one probe to capture the first measurement at the first test point based on the location of the first test point and one or more components within a proximity of the first test point.

5. The method of claim 1, wherein the first test point is identified by at least one machine-learning algorithm, wherein the at least one machine-learning algorithm is trained based on at least one dataset associated with previously identified test points.

6. The method of claim 1, wherein the test fixture or the circuit board includes an alignment indicator, wherein the alignment indicator includes a reference point location on the test fixture or the circuit board.

7. The method of claim 1,
   wherein the device executes an application to obtain remote access to a debug port of the circuit board, and
   wherein the robotic device is controlled by a controller device executing a script, wherein the script includes a plurality of test points.

8. A system comprising:
   one or more processors; and
   one or more memories storing instructions that, when executed by the one or more processors, cause the system to perform a process comprising:
   aligning, by a robotic device, at least one probe with a circuit board on a test fixture;
   receiving, from a device, a verification instruction that the at least one probe aligns with the circuit board, wherein the device is remote from the test fixture;
   in response to receiving the verification instruction from the device, applying, by the robotic device, the at least one probe to a first test point on the circuit board; and
   collecting, by the robotic device connected to an oscilloscope, a first measurement from the first test point on the circuit board.

9. The system of claim 8, wherein the process further comprises:
   identifying a second test point on the circuit board;
   changing a location of the at least one probe from the first test point to the second test point;
   applying, by the robotic device, the at least one probe to the second test point on the circuit board; and
   collecting a second measurement from the second test point on the circuit board.

10. The system of claim 8, wherein the process further comprises:
    selecting the at least one probe from a plurality of probes based on a location of the first test point on the circuit board.

11. The system of claim 8, wherein the process further comprises:
    identifying a location of the first test point on the circuit board on the test fixture, wherein the first test point is selected on a user interface;
    selecting a diameter size of the at least one probe to capture the first measurement at the first test point based on the location of the first test point and one or more components within a proximity of the first test point.

12. The system of claim 8, wherein the first test point is identified by at least one machine-learning algorithm, wherein the at least one machine-learning algorithm is trained based on at least one dataset associated with previously identified test points.

13. The system of claim 8, wherein the test fixture or the circuit board includes an alignment indicator, wherein the alignment indicator includes a reference point location on the test fixture or the circuit board.

14. The system of claim 8,
wherein the device executes an application to obtain remote access to a debug port of the circuit board, and
wherein the robotic device is controlled by a controller device executing a script, wherein the script includes a plurality of test points.

15. A non-transitory computer-readable medium storing instructions that, when executed by a computing system, cause the computing system to perform operations comprising:
aligning, by a robotic device, at least one probe with a circuit board on a test fixture;
receiving, from a device, a verification instruction that the at least one probe aligns with the circuit board, wherein the device is remote from the test fixture;
in response to receiving the verification instruction from the device, applying, by the robotic device, the at least one probe to a first test point on the circuit board; and
collecting, by the robotic device connected to an oscilloscope, a first measurement from the first test point on the circuit board.

16. The non-transitory computer-readable medium of claim 15, wherein the operations further comprise:
identifying a second test point on the circuit board;
changing a location of the at least one probe from the first test point to the second test point;
applying, by the robotic device, the at least one probe to the second test point on the circuit board; and
collecting a second measurement from the second test point on the circuit board.

17. The non-transitory computer-readable medium of claim 15, wherein the operations further comprise:
selecting the at least one probe from a plurality of probes based on a location of the first test point on the circuit board.

18. The non-transitory computer-readable medium of claim 15, wherein the operations further comprise:
identifying a location of the first test point on the circuit board on the test fixture, wherein the first test point is selected on a user interface;
selecting a diameter size of the at least one probe to capture the first measurement at the first test point based on the location of the first test point and one or more components within a proximity of the first test point.

19. The non-transitory computer-readable medium of claim 15, wherein the first test point is identified by at least one machine-learning algorithm, wherein the at least one machine-learning algorithm is trained based on at least one dataset associated with previously identified test points.

20. The non-transitory computer-readable medium of claim 15,
wherein the test fixture or the circuit board includes an alignment indicator, wherein the alignment indicator includes a reference point location on the test fixture or the circuit board,
wherein the device executes an application to obtain remote access to a debug port of the circuit board, and
wherein the robotic device is controlled by a controller device executing a script, wherein the script includes a plurality of test points.

* * * * *